(12) United States Patent
Costa et al.

(10) Patent No.: US 7,463,097 B2
(45) Date of Patent: Dec. 9, 2008

(54) SYSTEMS INVOLVING TEMPERATURE COMPENSATION OF VOLTAGE CONTROLLED OSCILLATORS

(75) Inventors: Damian Costa, San Diego, CA (US); William James Huff, San Diego, CA (US)

(73) Assignee: NXP B.V., Eindhoven (NL)

( * ) Notice: Subject to any disclaimer, the term of this patent is extended or adjusted under 35 U.S.C. 154(b) by 119 days.

(21) Appl. No.: 11/613,216

(22) Filed: Dec. 20, 2006

(65) Prior Publication Data

US 2008/0150641 A1  Jun. 26, 2008

(51) Int. Cl.
*H03B 5/04* (2006.01)
*H03B 5/12* (2006.01)
*H03L 1/02* (2006.01)
*H03L 7/099* (2006.01)

(52) U.S. Cl. .................. 331/14; 331/17; 331/36 C; 331/176; 331/177 V; 331/179

(58) Field of Classification Search ............... 331/8, 331/10, 11, 14, 17, 18, 25, 36 C, 66, 176, 331/177 V, 179
See application file for complete search history.

(56) References Cited

U.S. PATENT DOCUMENTS 6,211,745 B1 * 4/2001 Mucke et al. ............ 331/117 R
6,545,547 B2 * 4/2003 Fridi et al. .................... 331/16

* cited by examiner

*Primary Examiner*—David Mis (57) ABSTRACT

Systems involving temperature compensation of voltage controlled oscillators are provided. In this regard, a representative system incorporates: a voltage controlled oscillator (VCO) having a tuning port and a phase-locked loop (PLL); and a temperature dependent voltage source. The VCO selectively exhibits one of a coarse tuning mode in which the temperature dependent voltage source is electrically connected to the VCO tuning port, and a locked mode in which the temperature dependent voltage source is not electrically connected to the VCO tuning port such that the PLL controls the frequency of the VCO.

32 Claims, 7 Drawing Sheets

SYSTEMS INVOLVING TEMPERATURE COMPENSATION OF VOLTAGE CONTROLLED OSCILLATORS

TECHNICAL FIELD

This invention relates generally to voltage controlled oscillators and the devices in which such oscillators operate or with which such oscillators are integrated.

DESCRIPTION OF THE RELATED ART

Modern communication systems typically employ a voltage controlled oscillator (VCO), in conjunction with a phase locked loop (PLL), to tune to the desired channel frequency. The trend for multi-standard and multi-mode capable devices demands a widely tunable VCO that is highly stable. One scheme to simultaneously achieve a large VCO tuning range and a small VCO gain ($K_{VCO}$) divides a single wide-range tuning curve into several narrower sub-bands with sufficient frequency overlap. With this approach, a digital coarse-tuning algorithm is first run to assign the closest sub-band of the free running VCO to the desired frequency with the proper selection from a switched-capacitor bank in the resonator circuit (tank). After coarse tuning, the PLL fine tunes the oscillation frequency to remove any remaining frequency error by adjusting the voltage at the VCO tuning port ($V_{tune}$) which controls the continuously-variable capacitance of a varactor.

The continuous reception of some systems, such as television (TV) tuners and full-duplex cellular transceivers, strictly restricts when the discrete VCO calibration can occur. For example in TV tuners, digital VCO tuning can only happen upon a channel change. Any temperature-induced drift in VCO frequency while the channel remains unchanged relies solely on the PLL to maintain lock by shifting $V_{tune}$ along the previously chosen sub-band so as to restore the desired frequency. Since the continuous tuning range of any sub-band is limited, the ability of the PLL to compensate for temperature drift after discrete tuning is also restricted. Because loss of PLL lock catastrophically compromises quality of reception, a portion of a conventional VCO's tuning range typically is set aside specifically to accommodate frequency drift with temperature.

One previously proposed technique to minimize VCO frequency drift with temperature is to bias the reference side of the varactor with a compensating temperature variable voltage source. This technique, however, suffers several perceived drawbacks. First, in practical implementation, at least one additional varactor is placed in parallel with the original varactor, thus adding additional tank capacitance and, therefore, decreasing the maximum oscillation frequency. Secondly, noise from the circuitry generating the compensating voltage tends to degrade the VCO phase noise performance, particularly near the carrier where on-chip filtering of the bias noise is less effective.

SUMMARY

Systems involving temperature compensation of voltage controlled oscillators are provided. In this regard, an exemplary embodiment of such a system comprises: a voltage controlled oscillator (VCO) having a tuning port and a phase-locked loop (PLL); and a temperature dependent voltage source. The VCO selectively exhibits one of a coarse tuning mode in which the temperature dependent voltage source is electrically connected to the VCO tuning port, and a locked mode in which the temperature dependent voltage source is not electrically connected to the VCO tuning port such that the PLL controls the frequency of the VCO.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Systems involving temperature compensation of voltage controlled oscillators (VCOs) are provided. In this regard, some embodiments compensate for VCO frequency drift with temperature by applying a temperature dependent voltage source to one or more varactors during digital VCO coarse tuning. As compared to conventional discrete VCO tuning in which varactor voltage is held at a fixed voltage (usually one half of the supply voltage), the varactor voltage in such an embodiment becomes a programmable (and potentially optimized) function of temperature. This allows selection of a digital coarse tuning setting that better permits the phase-locked loop (PLL) to adjust $V_{tune}$ to accommodate temperature drifts. Since the temperature compensating voltage source preferably is only switched to the VCO tuning port during coarse tuning and switched out under normal locked operation (where the PLL controls the VCO frequency), noise from the circuitry generating the temperature dependent calibration voltage has no effect on the phase noise performance. Furthermore, since no additional circuitry shunts the VCO tank, no additional parasitic capacitance is contributed that can impact the achievable VCO oscillation frequency.

Figure 1:
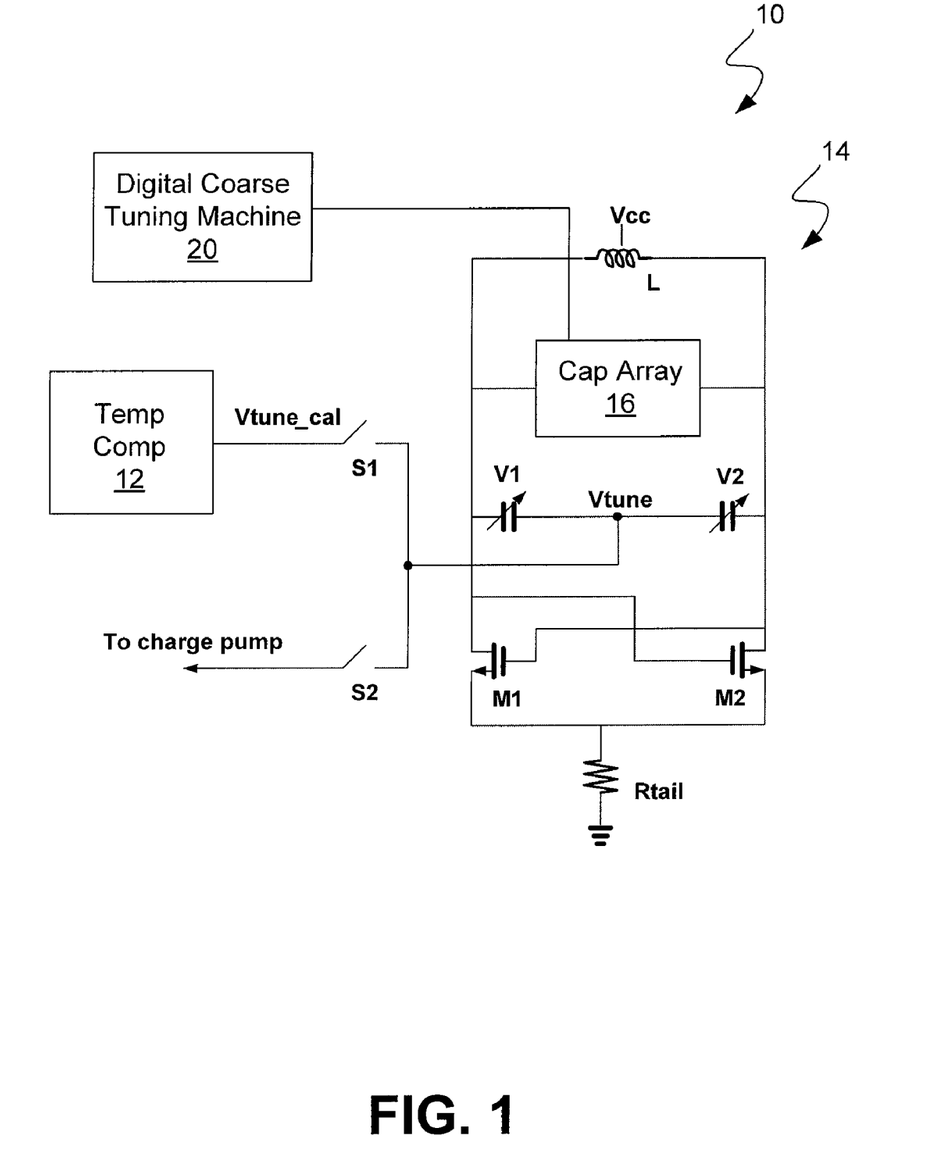
FIG. 1 is a block diagram of an embodiment of a temperature compensated VCO.

Referring to FIG. 1, an embodiment of a system involving temperature compensation of a VCO is shown. In this embodiment, the system 10 includes a temperature compensation block 12 that operates together with a VCO 14 to correct for frequency drift during open-loop digital coarse tuning. The VCO core in this embodiment comprises a cross-coupled NMOS LC VCO that includes active devices $M_1$ and $M_2$, a discrete switched-capacitance array 16, continuously variable-capacitance varactors $V_1$ and $V_2$, a spiral inductor L, and a tail resistor $R_{tail}$.

A switch S1 selectively electrically connects a temperature compensation circuit 18 to the common mode voltage of the varactors $V_1$ and $V_2$ and a switch S2 selectively electrically connects the common mode voltage to a charge pump. A digital coarse tuning machine 20 also is provided that is electrically connected to the array 16.

When digital coarse calibration is enabled, switch S2 is open and switch S1 is closed forcing the common-mode voltage of varactors $V_1$ and $V_2$ to the output voltage from the temperature compensation circuit ($V_{tune\_cal}$). The tuning machine 20 executes a digitally-based algorithm to switch in the proper value from the switched-capacitance array 16 to select the nearest sub-band to the desired frequency. For discrete VCO tuning, the positions of switches S1 and S2 are reversed to connect the VCO to the charge pump of the PLL and disconnect the temperature compensation block. The feedback action of the loop then adjusts $V_{tune}$ so that the desired frequency is obtained. After a temperature drift, the PLL re-adjusts $V_{tune}$ to keep the frequency constant and maintain lock. By giving $V_{tune\_cal}$ the proper temperature dependence, the digital coarse tuning machine selects a coarse tuning setting that allows the PLL to accommodate the required shift in $V_{tune}$.

The frequency drift with temperature of VCO 14 mainly arises from the temperature dependence of the drain-to-bulk diode capacitance ($C_{db}$) of transistors $M_1$, $M_2$, and the NMOS switches inside the switched-capacitance array, and varactors $V_1$ and $V_2$. Since the temperature coefficients of these elements are positive, the VCO oscillation frequency ($f_{osc}$) decreases with increasing temperature, since as is well known, $$f_{osc} = \frac{1}{2\pi\sqrt{LC}} \quad (1)$$

where C is the total resonator capacitance.

Figure 2:
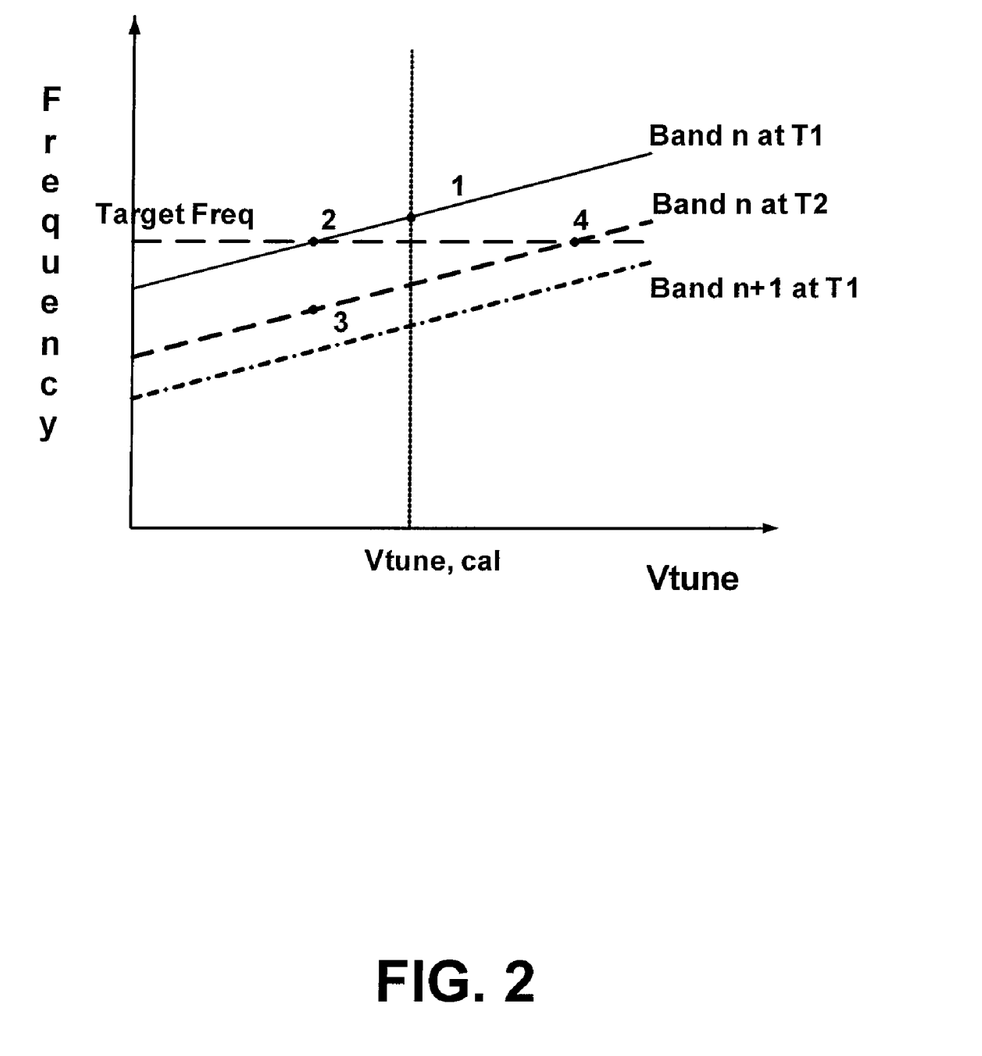
FIG. 2 is a graph of the response of two idealized tuning curves of a band-switched VCO to a positive change in temperature.

FIG. 2 shows two idealized tuning curves of a band-switched VCO and the corresponding downward shift in frequency as the temperature increases from T1 to T2. Operating points 1-4 illustrate the response of the VCO to digital coarse tuning and a temperature drift. In this example, the discrete tuning algorithm is initiated at temperature T1 with $V_{tune}$ forced to $V_{tune\_cal}$. Band n is selected as the best band, and the VCO is left at operating point 1. The loop is then closed at temperature T1, and the PLL shifts the VCO to operating point 2, the desired target frequency. In response to a temperature increase from T1 to T2, band n shifts downward as the VCO drifts to a lower frequency at operating point 3. In order to maintain lock at temperature T2, the PLL is forced to shift VCO to operating point 4. If operating 4 is beyond the available tuning range of band n, then the PLL would lose lock.

Figure 3:
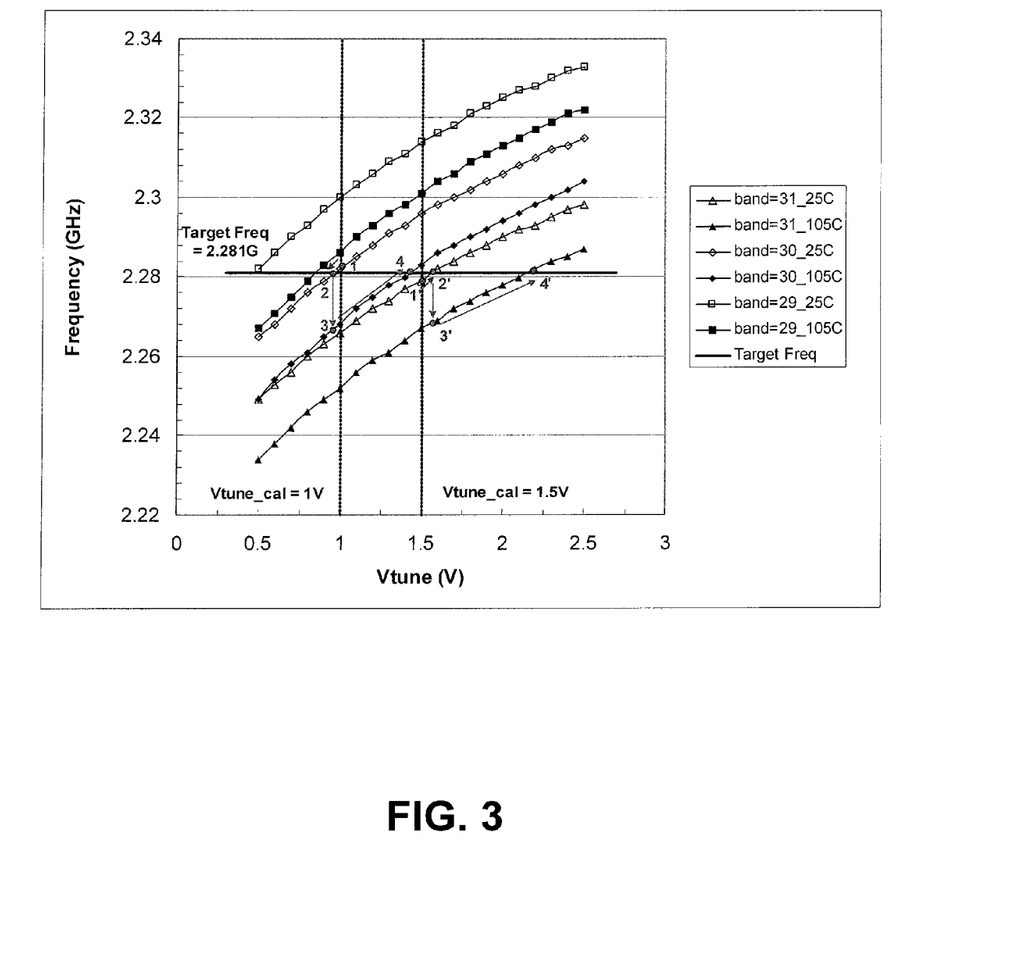
FIG. 3 is a plot showing the shift in VCO operating condition after digital coarse tuning is done at a cold temperature and a positive temperature change follows.
Figure 4:
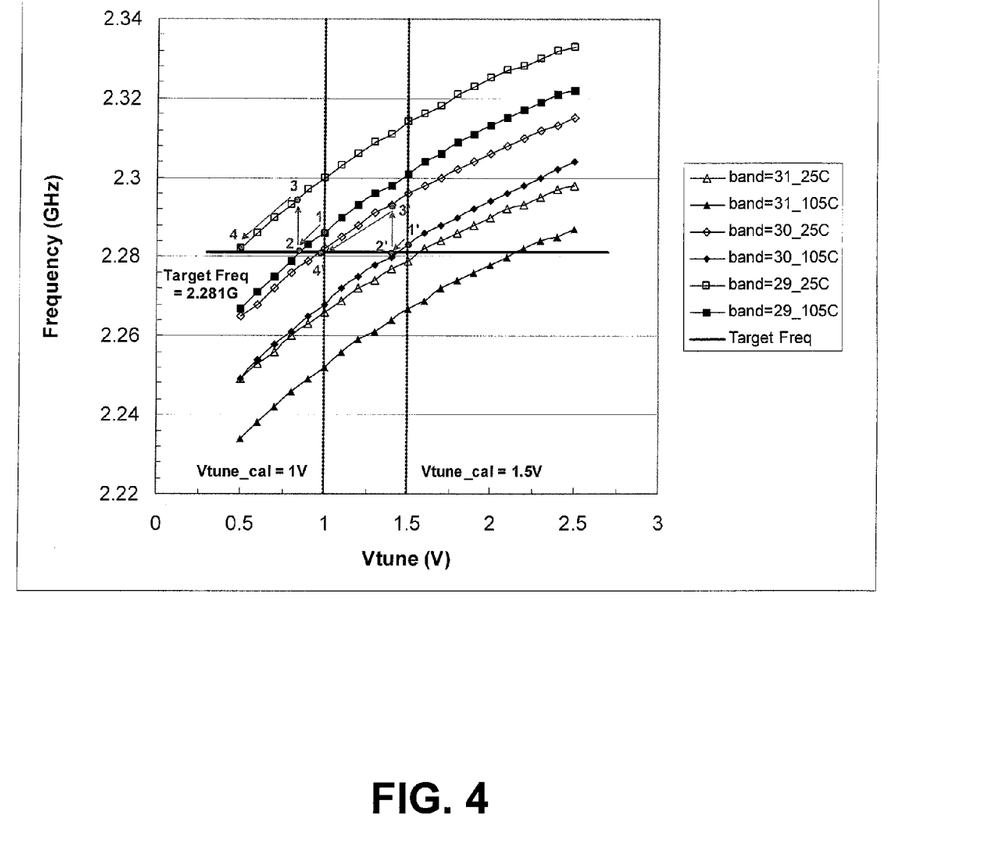
FIG. 4 is a plot showing the shift in VCO operating condition after digital coarse tuning is done at a hot temperature and a negative temperature change follows.

Two extreme cases are 1) performing the coarse-tuning algorithm at a cold temperature ($T_{cold}$) followed by a positive temperature drift or 2) running the discrete tuning at a hot temperature ($T_{hot}$) followed by a negative temperature drift. FIGS. 3 and 4 show simulated VCO tuning curves for these two scenarios and illustrate the importance of judiciously selecting $V_{tune\_cal}$ so that the PLL can robustly maintain lock. FIG. 3 shows three VCO tuning sub-bands at temperature T=25 C (open symbols) and the corresponding sub-bands at T=105 C (solid symbols) over a tuning range of $0.5V \leq V_{tune} \leq 2.5V$. In this scenario the desired frequency is 2.281 GHz and the digital coarse tuning is invoked at T=25 C with the VCO's analog input set at two different values, $V_{tune\_cal}$=1V and 1.5V. Operating points 1-4 and 1'-4' depict the response of the VCO to a positive shift in temperature to T=105 C. With $V_{tune\_cal}$=1V discrete tuning selects band 30 (operating point 1) and the PLL initially locks the VCO at operating point 2 at T=25C. Due to the temperature rise to T=105 C, the sub-band shifts downward changing the operating point to 3 and the PLL re-adjusts the VCO to operating point 4 to return the frequency to 2.281 GHz. Both the initial and final VCO locking points occur with substantial margin from the edges of the tuning range. With $V_{tune\_cal}$=1.5V, discrete tuning picks band 31 (operating point 1') and the PLL initially locks at T=25 C leaving the VCO at operating point 2'. Due to the temperature rise to T=105 C, the VCO drifts to operating point 3' and PLL re-adjusts the VCO to operating point 4' to re-establish the desired frequency. In this example, both values of $V_{tune\_cal}$ allow the PLL to maintain lock after a positive temperature drift, but with $V_{tune\_cal}$=1V, the PLL leaves the VCO at a more robust operating point, farther from the tuning edges, as compared that with $V_{tune\_cal}$=1.5V.

FIG. 4 is a plot of the same VCO sub-bands at T=25 C and T=105 C and the same target frequency of 2.281 GHz as in FIG. 3, but shows the scenario with digital coarse-tuning executed at T=105 C and a subsequent negative temperature drift to T=25C. Operating points 1-4 and 1'-4' depict the VCO behavior with $V_{cal}$=1V and 1.5V, respectively. Unlike the scenario of FIG. 3, with $V_{tune\_cal}$=1V, the PLL just loses lock, as operating point 4 is pushed to the lower $V_{tune}$ limit without yet reaching the target frequency. With $V_{tune\_cal}$=1.5V, the PLL easily maintains lock after the negative temperature change, where as in the scenario of FIG. 3, with $V_{tune\_cal}$=1.5V, the final locking point was less secure as the VCO was pushed out near the upper $V_{tune}$ limit. The results of FIGS. 3 and 4 clearly demonstrate that the optimum $V_{tune\_cal}$ for the PLL to contend with VCO temperature drift depends on the temperature at which digital coarse-tuning is done and the polarity of the temperature change.

Figure 5:
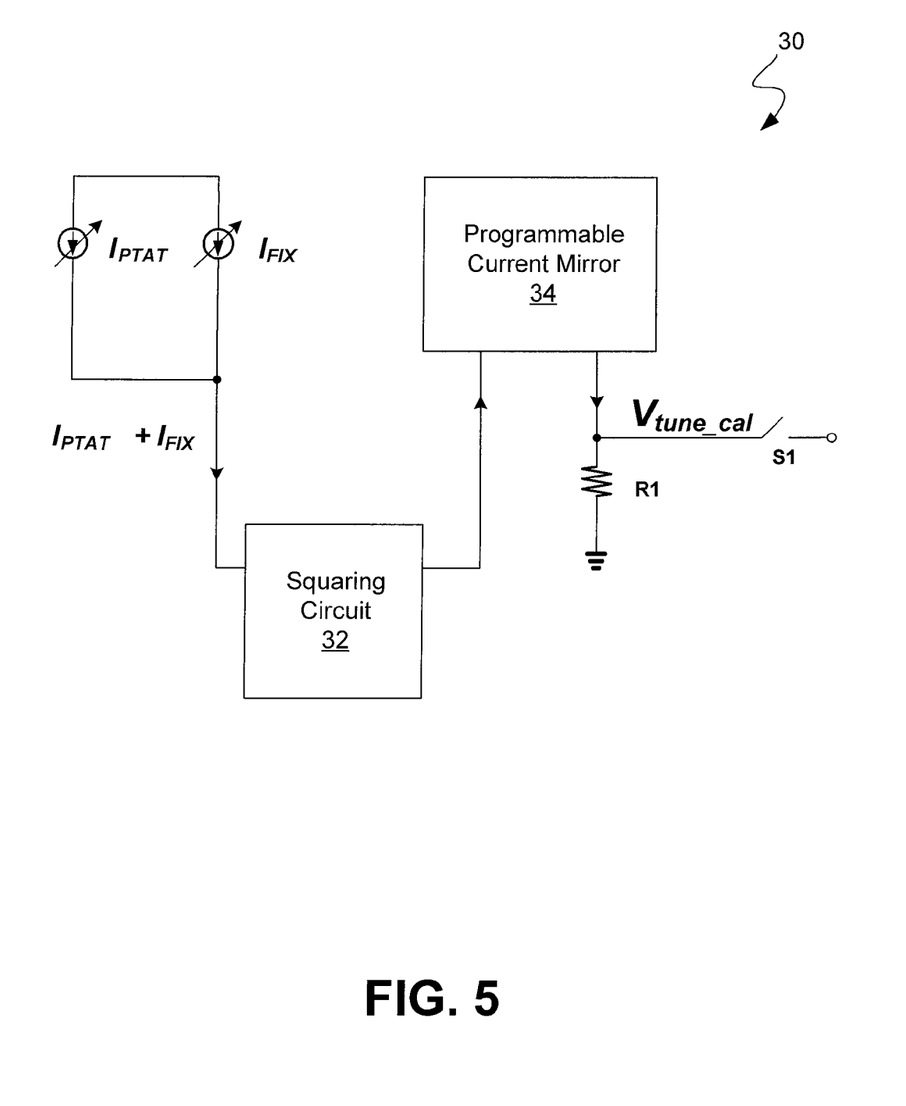
FIG. 5 is a block diagram of an embodiment of a temperature compensating voltage generator.

FIG. 5 is a block diagram of an embodiment of a temperature compensating module 30 that generates a programmable, temperature variable voltage ($V_{tune\_cal}$) that can be applied to a VCO tuning port during digital coarse-tuning. This module includes a programmable Proportional To Absolute Temperature (PTAT) current source $I_{PTAT}$, a temperature independent current source $I_{FIX}$, a squaring circuit 32, and a programmable current mirror 34. The generation of PTAT and temperature independent currents is well known in the art and therefore not presented here. These current modules are configured as parallel arrays of switchable weighted current sources to provide programmability of the temperature dependence of the sum current $I_{SUM}=I_{PTAT}+I_{FIX}$. In this embodiment the slope of the sum current is increased by processing with a squaring circuit, such as a simple one-quadrant translinear squarer. In other embodiments, the sum current could be mapped to a more complicated function. The squared current is fed to programmable current mirror 34 that scales the entire curve and finally the scaled current is forced through a resistor R1 to generate the desired temperature variable output voltage $V_{tune\_cal}$. Process variation of $V_{tune\_cal}$ can virtually be eliminated by making resistor R1 the same type as that used in generating $I_{PTAT}$ and $I_{FIX}$.

Figure 6:
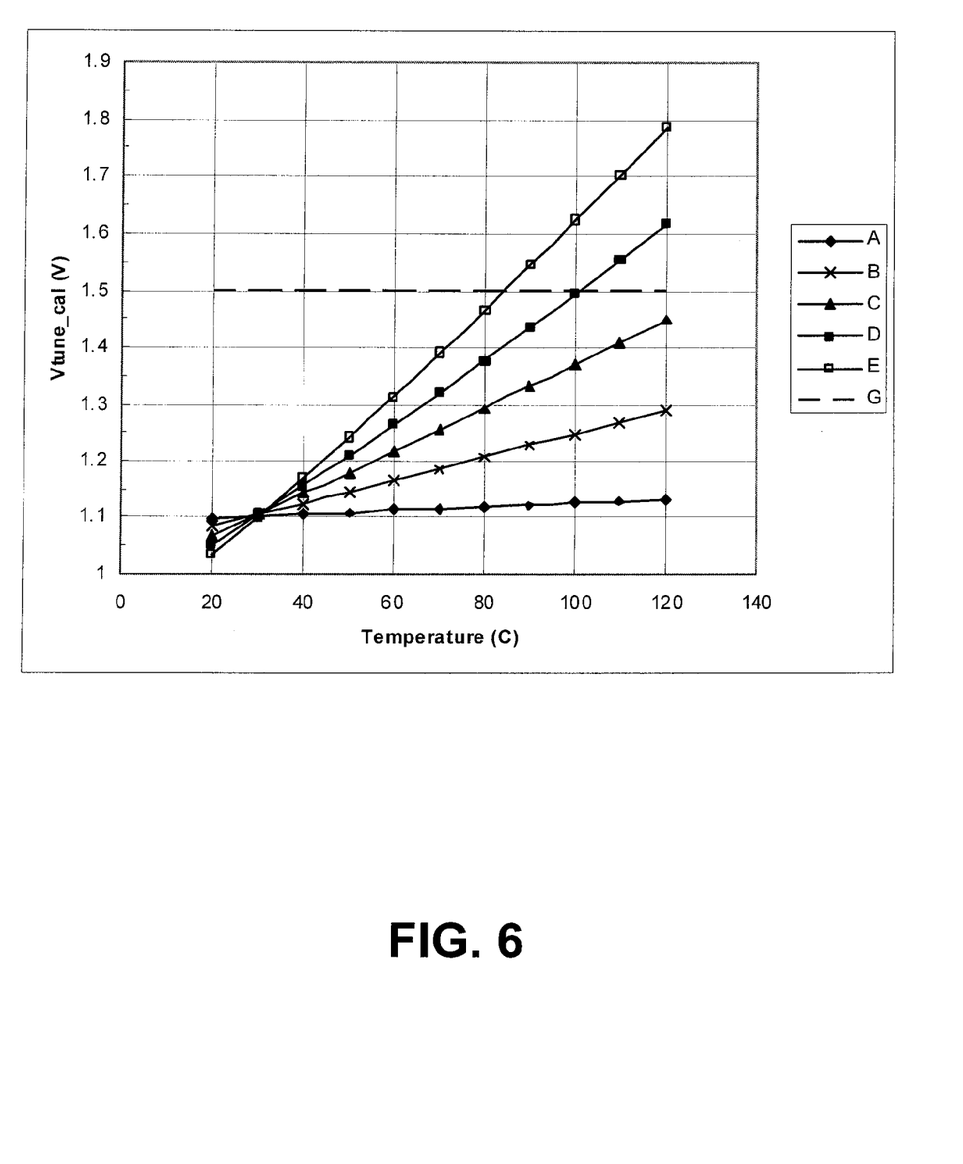
FIG. 6 is a graph of example output curves versus temperature of a temperature dependent voltage source.

FIG. 6 shows an example of simulated $V_{tune\_cal}$ vs temperature curves (A-E) that can be generated by the embodiment of the temperature variable voltage source 30. In FIG. 6 the mirroring ratio of programmable current mirror 34 is held constant as the partitioning of $I_{PTAT}$ and $I_{FIX}$ is adjusted to vary the strength of the temperature dependence. A change in the mirroring ratio of the current mirror shifts the entire curves vertically. For comparison, FIG. 6 also shows the fixed, temperature-independent $V_{tune\_cal}$=1.5V that would be used with conventional digital coarse tuning.

For the example in FIGS. 3 and 4, $V_{-cal}$=1.0V and $V_{-cal}$=1.5V were deemed to be "good" values when the digital VCO calibration is performed at T=25 C and T=105 C, respectively. Curve D in FIG. 6 is then the correspondingly optimal curve since it yields $V_{tune\_cal}$=1.05V at T=25 C and $V_{tune\_cal}$=1.52V at T=105 C. Since the separation of the VCO tuning sub-bands exhibit some dependence on process, supply voltage, oscillation frequency, and mismatch, the included programmability of $V_{tune\_cal}$ assures finding an optimum $V_{tune\_cal}$ curve to correct for the temperature sensitivity of the VCO.

It should be noted that the aforementioned technique not only compensates for the temperature-induced frequency drift of the VCO, but does so without any degradation in the phase noise or maximum frequency of oscillation of the VCO.

As described in the representative embodiments above, the frequency response of a voltage controlled oscillator (VCO) with digital coarse tuning can be temperature compensated by biasing the VCO tuning port with a temperature-dependent voltage source during digital coarse tuning. The output of this temperature-dependent source preferably is a programmable, polynomial function of temperature. This allows selection of a coarse tuning setting that can optimize the locked PLL's ability to accommodate temperature drifts. Since the temperature-dependent voltage source, in some embodiments, is only connected to the VCO during open-loop discrete coarse tuning and, not during closed loop operation, the performance of the VCO is not degraded.

Figure 7:
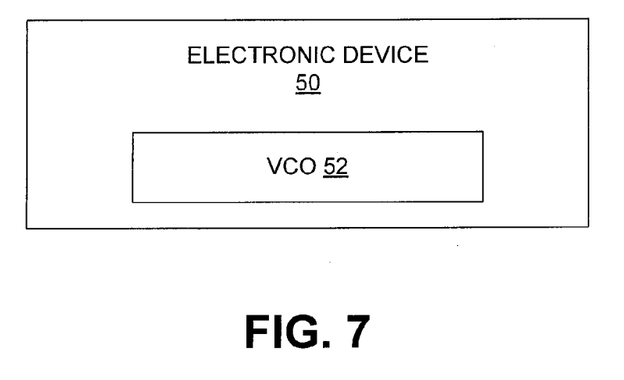
FIG. 7 is schematic diagram of an example embodiment of an electronic device that implements the VCO of FIG. 1.

In this regard, FIG. 7 is a schematic diagram depicting an embodiment of an electronic device that implements such a VCO. In particular, system 50, which can be configured as various types of devices (e.g., set-top boxes, televisions, computing devices, such as portable appliances and gaming units satellite systems, entertainment devices, MP3 players, iPod® players, cell phones, wireless communication receivers and communication devices), incorporates an embodiment of a VCO 52. Specifically, VCO 52 is provisioned with one or more temperature compensation features, e.g., those features described with respect to the previous representative embodiments. As such, the VCO facilitates tuning of the electronic device 50.

Figure 8:
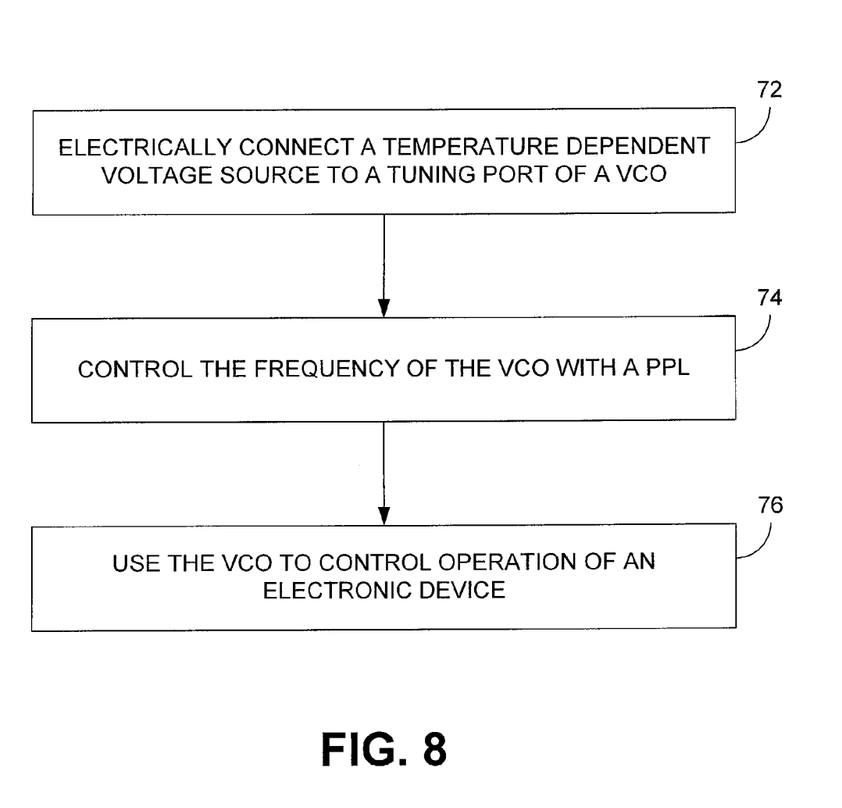
FIG. 8 is a flowchart of an example embodiment of a method of operating the VCO of FIG. 1.

Operation of an electronic device, such as that depicted in FIG. 7 is depicted in the flowchart of FIG. 8. As shown in FIG. 8, the functionality may be construed as beginning at block 72, in which a temperature dependent voltage source is electrically connected to a tuning port of a voltage controlled oscillator. In block 74, a PLL is used to control the frequency of the VCO. Notably, selective use of the PLL can be responsive to the temperature dependent voltage source being electrically disconnected from the VCO tuning port. In block 76, the VCO is used to control operation of an electronic device, such as an electronic device in which the VCO is implemented or with which the VCO is integrated.

It will be apparent to those skilled in the art that various modifications and variations can be made to the structures described herein. It is intended that all such modifications and variations fall within the scope of the following claims and their equivalents.

We claim:

1. A system involving temperature compensation of a voltage controlled oscillator, said system comprising:
   a voltage controlled oscillator (VCO) having a tuning port and a phase-locked loop (PLL); and
   a temperature dependent voltage source comprising at least one current source;
   the VCO selectively exhibiting one of a coarse tuning mode in which the temperature dependent voltage source is electrically connected to the VCO tuning port, and a locked mode in which the temperature dependent voltage source is not electrically connected to the VCO tuning port such that the PLL controls frequency of the VCO.

2. The system of claim 1, wherein, in the locked mode, noise associated with the temperature dependent voltage source does not affect phase noise performance of the system.

3. The system of claim 1, wherein:
   the VCO comprises first and second varactors; and
   the temperature dependent voltage source, in the coarse tuning mode, is electrically connected to a common-mode voltage of the first and second varactors.

4. The system of claim 1, wherein:
   the VCO comprises a switched-capacitance array; and
   the system further comprises a tuning machine operative, responsive to selection of the coarse tuning mode, to switch in a value from the switched-capacitance array to select a nearest sub-band to a desired frequency.

5. The system of claim 1, wherein the temperature dependent voltage source comprises:
   a Proportional To Absolute Temperature current source ($I_{PTAT}$); and
   a temperature independent current source ($I_{FIX}$) electrically connected in parallel with the $I_{PTAT}$.

6. The system of claim 5, wherein each of the $I_{PTAT}$ and the $I_{FIX}$ is a switchable weighted current source.

7. The system of claim 5, wherein the temperature dependent voltage source further comprises means for increasing a slope of a sum current, wherein the sum current equals $I_{PTAT}$+$I_{FIX}$.

8. The system of claim 5, wherein the temperature dependent voltage source further comprises a squaring circuit operative to increase a slope of a sum current, wherein the sum current equals $I_{PTAT}$+$I_{FIX}$.

9. The system of claim 8, wherein the temperature dependent voltage source further comprises a programmable current mirror operative to scale the sum current.

10. The system of claim 1, wherein the VCO comprises a cross-coupled NMOS LC VCO.

11. The system of claim 1, wherein an output of the temperature dependent voltage source is a programmable, polynomial function of temperature.

12. The system of claim 1, wherein the temperature dependent voltage source is electrically connected to the VCO tuning port only during the coarse tuning mode of operation.

13. The system of claim 1, wherein the VCO is operative to exhibit the coarse tuning mode prior to exhibiting the locked mode.

14. The system of claim 1, further comprising an electronic device, wherein the VCO forms a portion of the electronic device.

15. The system of claim 14, wherein the electronic device is a set-top box.

16. The system of claim 14, wherein the electronic device is a television.

17. The system of claim 14, wherein the electronic device is a computing device.

18. A method involving temperature compensation of a voltage controlled oscillator, said method comprising:
   electrically connecting a temperature dependent voltage source to a tuning port of a voltage controlled oscillator, the temperature dependent voltage source comprising a current source; and
   using a phase-locked loop to control the frequency of the VCO responsive to the temperature dependent voltage source not being electrically connected to the VCO tuning port such that temperature-compensation of the VCO is provided.

19. The method of claim 18, further comprising using the VCO to control operation of an electronic device.

20. A system involving temperature compensation of a voltage controlled oscillator, the system comprising:
   means for providing a temperature dependent voltage, the means for providing a temperature dependent voltage comprising a means for providing a temperature dependent current;
   means for selectively, electrically connecting the means for providing a temperature dependent voltage to a tuning port of a voltage controlled oscillator(VCO); and
   means for controlling frequency of the VCO responsive to the means for providing a temperature dependent voltage being electrically disconnected from the VCO.

21. The method of claim 18, wherein:
   the VCO comprises first and second varactors; and further comprising electrically connecting the temperature dependent voltage source to a common-mode voltage of the first and second varactors in a coarse tuning mode.

22. The method of claim 18, wherein:
   the VCO comprises a switched-capacitance array; and
   further comprising, responsive to selection of a coarse tuning mode, switching in a value from the switched-capacitance array to select a nearest sub-band to a desired frequency.

23. The method of claim 18, wherein the temperature dependent voltage source comprises:
   a Proportional To Absolute Temperature current source ($I_{PTAT}$); and
   a temperature independent current source ($I_{FAX}$) electrically connected in parallel with the $I_{ptat}$.

24. The method of claim 23, wherein each of the $I_{PTAT}$ and the $I_{FIX}$ is a switchable weighted current source.

25. The method of claim 24, wherein the temperature dependent voltage source further comprises a programmable current mirror operative to scale the sum current.

26. The method of claim 18, wherein the temperature dependent voltage source outputs a programmable, polynomial function of temperature.

27. The system of claim 20, wherein:
   the VCO comprises first and second varactors; and
   the means for providing the temperature dependent voltage source, in a coarse tuning mode, is electrically connected to a common-mode voltage of the first and second varactors.

28. The system of claim 20, wherein:
   the VCO comprises a switched-capacitance array; and
   the system further comprises a means for tuning operative, responsive to selection of a coarse tuning mode, to switch in a value from the switched-capacitance array to select a nearest sub-band to a desired frequency.

29. The system of claim 20, wherein the means for providing the temperature dependent voltage source comprises:
   a Proportional To Absolute Temperature current source ($I_{PTAT}$); and
   a temperature independent current source ($I_{FIX}$) electrically connected in parallel with the $I_{PTAT}$.

30. The system of claim 29, wherein each of the $I_{PTAT}$ and the $I_{FIX}$ is a switchable weighted current source.

31. The system of claim 30, wherein the means for providing the temperature dependent voltage source further comprises a programmable current mirror operative to scale the sum current.

32. The system of claim 20, wherein an output of the means for providing the temperature dependent voltage source is a programmable, polynomial function of temperature.

* * * * *